United States Patent
Morishita et al.

(10) Patent No.: US 7,266,791 B2
(45) Date of Patent: Sep. 4, 2007

(54) HIGH LEVEL SYNTHESIS DEVICE, METHOD FOR GENERATING A MODEL FOR VERIFYING HARDWARE, METHOD FOR VERIFYING HARDWARE, CONTROL PROGRAM, AND READABLE RECORDING MEDIUM

(75) Inventors: Takahiro Morishita, Tenri (JP); Mitsuhisa Ohnishi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 524 days.

(21) Appl. No.: 10/850,153

(22) Filed: May 21, 2004

(65) Prior Publication Data

US 2005/0010387 A1 Jan. 13, 2005

(30) Foreign Application Priority Data

May 23, 2003 (JP) ............................. 2003-147025

(51) Int. Cl.
*G06F 17/50* (2006.01)
(52) U.S. Cl. ....................... 716/4; 716/5; 716/6; 716/18
(58) Field of Classification Search .................... 716/3, 716/4–6, 18; 703/13–22; 714/718, 719
See application file for complete search history.

(56) References Cited

U.S. PATENT DOCUMENTS

| 6,052,524 | A  | * | 4/2000  | Pauna ........................... 703/22 |
| 6,449,750 | B1 | * | 9/2002  | Tsuchiya ........................ 716/4 |
| 6,952,816 | B2 | * | 10/2005 | Gupta et al. ................... 716/18 |
| 6,993,469 | B1 | * | 1/2006  | Bortfeld ....................... 703/15 |
| 2002/0152061 | A1 | * | 10/2002 | Shimogori et al. ............ 703/21 |
| 2003/0154465 | A1 | * | 8/2003  | Bollano et al. ............. 717/137 |

FOREIGN PATENT DOCUMENTS

JP 10-149382 6/1998
JP 2001-014356 1/2001

* cited by examiner

*Primary Examiner*—Jack Chiang
*Assistant Examiner*—Nghia M. Doan
(74) *Attorney, Agent, or Firm*—Harness, Dickey & Pierce, P.L.C.

(57) ABSTRACT

A high level synthesis device includes a high level synthesis section and a cycle accurate model. The high level synthesis section may perform high level synthesis of hardware including a plurality of components and a controller for controlling the plurality of components. The cycle accurate model may be configured to verify a state of at least one of the plurality of components and the controller at a cycle accurate level, with a general-purpose programming language.

44 Claims, 19 Drawing Sheets

FIG.4

Component operation information

| Symbol | Hardware operation information (port information) |
|---|---|
| C | Constant (output : O1) |
| R | Register (input : I1  output : O1) |
| OP | Operator which adds input I1 and input I2 when the input I3 is "0", and subtracts input I2 from input I1 when input I3 is "1" (inputs: I1, I2, I3; output: O1) |

109

```
int R_rdata;
int R_wdata;
```

```
int cSTATE;
int nSTATE;
```

FIG.10

```
typedef enum _CTRL_STATE
{
   STATE_A,
   STATE_B
} CTRL_STATE;
```

FIG.11

```
R_wdata = execOP(C,R_rdata,CTRL_O1);
```

FIG.12

```
int execOP (int input1, int input2, int input3)
{
    if (input3 == 0)
        return input1 + input2;
    else if (input3 == 1)
        return input1 - input2;
    else
        error();
}
```

FIG.13

```
#define CTRL_01 (((cSTATE == STATE_A)?0:(((cSTATE == STATE_B)?1:-1))
```

FIG.14

```
switch (cSTATE){
  case STATE_A:
    if (I == 1) nSTATE = STATE_B;
    else nSTATE = STATE_A;
    break;
  case STATE_B:
    if (I == 1) nSTATE = STATE_A;
    else nSTATE = STATE_B;
    break;
  default:
    error();
}
```

FIG.15

```
void calculate_circuit (void)
{
    R_wdata = execOP(C,R_rdata,CTRL_01);

switch (cSTATE){
        case STATE_A:
            if (I == 1) nSTATE = STATE_B;
            else nSTATE = STATE_A;
            break;
        case STATE_B:
            if (I == 1) nSTATE = STATE_A;
            else nSTATE = STATE_B;
            break;
        default:
            error();
    }
}
```

FIG.16

```
void update_circuit (void)
{
  R_rdata = R_wdata;

cSTATE = nSTATE;
}
```

FIG.18

```
process (clk)
begin
    if (clk'event and clk='1') then
        if (Wen = '1') then
            RAM1(Addr) <= Din;
        elsif (Ren = '1') then
            Dout <= RAM1(Addr);
        end if;
    end if;
end process;
```

FIG.19

```
int calculated_Addr;

void calculate_RAM1 (void)
{
   if (Wen == 1){
      RAM1_wdata[Addr] = Din;
   }
   else if (Ren == 1){
      Dout = RAM1[Addr]_rdata;
   }
   calculated_Addr = Addr;
}
```

FIG.20

```
Void update_RAM1_all (void)
{
   int i;
   for (i=0; i<SIZE; i++){
      RAM1_rdata[i] = RAM1_wdata[i];
   }
}
```

FIG.21

```
Void update_RAM1 (void)
{
    if (Wen == 1){
        RAM1_rdata[calculated_Addr] = RAM1_wdata[calculated_Addr];
    }
}
```

FIG.23

```
void calculate_block2 (void)
{
   R2_wdata = execOP(C, R_rdata, CTRL_O1);
}
```

FIG.24

```
void calculate_block3 (void)
{
   R3_wdata = execOP(C, R_rdata, CTRL_O1);
}
```

FIG. 25

```
int execOP (int input1, int input2, int input3)
{
    static int result;

if (cycle_last_calculated < cycle_current_calculate {
        if (input3 == 0)
            result = input1 + input2;
        else if (input3 == 1)
            result = input1 - input2;
        else
            error();
        cycle_last_calculated = cycle_current_calculate;
    } return result;
}
```

HIGH LEVEL SYNTHESIS DEVICE, METHOD FOR GENERATING A MODEL FOR VERIFYING HARDWARE, METHOD FOR VERIFYING HARDWARE, CONTROL PROGRAM, AND READABLE RECORDING MEDIUM

This non-provisional application claims priority under 35 U.S.C., §119(a), on Patent Application No. 2003-147025 filed in Japan on May 23, 2003, the entire contents, of which are hereby incorporated by reference.

BACKGROUND OF THE INVENTION

1. Field of the Invention

The present invention relates to a high level synthesis device, a method for generating a model for verifying hardware, a method for verifying hardware, a control program, and a readable recording medium. More specifically, the present invention relates to a high level synthesis device for generating a cycle accurate model, for verifying hardware at a cycle accurate level (the precision of a clock cycle), with a general-purpose programming language; a method for generating such a cycle accurate model; a method for verifying hardware using such a cycle accurate model; a control program for causing a computer to execute such a method; and a readable recording medium having such a control program recorded thereon.

2. Description of the Related Art

Recently, in developing large-scale system LSIs, it is verified whether the operation of designed hardware satisfies certain specifications required of a corresponding system or not by simulation.

Conventionally, hardware is verified at a cycle accurate level using an HDL (Hardware Description Language) simulator. It is verified by simulation using the HDL simulator whether a performance of the hardware, such as an operating speed or the like, satisfies specifications required of the system.

Generally an HDL simulator simulates a circuit operation described with a hardware description language such as, for example, VHDL (Very High Speed Integrated Hardware Description Language). The HDL simulator performs a simulation with an event driving system. Namely, the HDL simulator monitors a signal change in the circuit at a time unit which is shorter than a clock cycle, and propagates the signal change in the circuit to a signal which is transmitted through a line connected to the circuit.

In a system including hardware and software, an operation of the hardware described with a hardware description language and an operation of the software described with a general-purpose programming language can be verified in association with each other. In such a case, the hardware is debugged using an HDL simulator, and the software is debugged using a software debugger.

Use of an HDL simulator for performing a simulation with an event driving system to verify hardware has the following problems. The time unit of simulation is shorter than a clock cycle. Accordingly, verification of hardware at a cycle accurate level accompanies redundant and wasteful calculations, which reduces the efficiency. In the case where the circuit to be verified is large-scale or the test pattern is long, the simulation requires a great amount of calculation and is time-consuming. In addition, an HDL simulator is expensive, which increases the cost for developing the system LSI.

As described above, hardware described with a hardware description language and software described with a general-purpose programming language can be verified in association with each other by debugging the hardware by an HDL simulator and debugging the software by a software debugger. In such a case, the debuggers are of different languages. It is time-consuming to match the languages, which reduces the efficiency.

With these problems, methods for verifying hardware without using an HDL simulator have been studied.

Japanese Laid-Open Publication No. 10-149382 discloses a method for verifying hardware and software in association with each other by simulating an operation of the hardware using a general-purpose programming language.

According to this method, hardware devices which operate in parallel are represented by a general-purpose programming language, for example, the C language. Such hardware devices are debugged so as to verify the hardware and software in association with each other. This provides high efficiency. Although this method can verify hardware at an algorithm level, the verification precision at a cycle accurate level is low. Thus, this method cannot verify whether the hardware satisfies certain specifications, including the operating speed, required of the system.

Japanese Laid-Open Publication No. 2001-14356 discloses a method for verifying hardware at a cycle accurate level at high speed. According to this method, an operation description which indicates the operations of all the arithmetic operators of the hardware is generated, and a verification model is generated with a general-purpose programming language.

The verification model disclosed in Japanese Laid-Open Publication No. 2001-14356 can cause a circuit obtained by high level synthesis to operate at a level equivalent to a cycle accurate level. However, this verification model cannot monitor the state of the circuit at an arbitrary clock cycle.

SUMMARY OF THE INVENTION

According to one aspect of the invention, a high level synthesis device includes a high level synthesis section for performing high level synthesis of hardware including a plurality of components and a controller for controlling the plurality of components; and a cycle accurate model generation section for generating a cycle accurate model, capable of verifying a state of at least one of the plurality of components and the controller at a cycle accurate level, with a general-purpose programming language.

In one embodiment of the invention, the cycle accurate model generation section verifies the hardware using the cycle accurate model.

In one embodiment of the invention, the high level synthesis section performs high level synthesis of the hardware at a register transfer level.

In one embodiment of the invention, the cycle accurate model generation section generates the cycle accurate model based on (i) operation information on the plurality of components, (ii) connection information which represents at least one of a connection between a component and another component among the plurality of components and a connection between one of the plurality of components and the controller, and (iii) controller information which represents a state transition of the controller.

In one embodiment of the invention, the cycle accurate model generation section generates component state calculation expressions for calculating states of the plurality of components and a controller state calculation expression for calculating a state of the controller with the general-purpose programming language based on the operation information, the connection information, and the controller information.

In one embodiment of the invention, the cycle accurate model generation section sets reading variables and writing variables. The cycle accurate model generation section sets reading variable storage areas for storing the reading variables and writing variable storage areas for storing the writing variables.

In one embodiment of the invention, the reading variables include component reading variables indicating variables which are read from the plurality of components and a controller reading variable indicating a variable which is read from the controller; the writing variables include component writing variables indicating variables which are to be written into the plurality of components and a controller writing variable indicating a variable which is to be written into the controller; the reading variable storage areas include component reading variable storage areas for storing the component reading variables, and a controller reading variable storage area for storing the controller reading variable; and the writing variable storage areas include component writing variable storage areas for storing the component writing variables, and a controller writing variable storage area for storing the controller writing variable.

In one embodiment of the invention, the cycle accurate model generation section generates, with the general-purpose programming language, (i) a calculation function for calculating the states of the components and the state of the controller from the reading variables using the component state calculation expressions and the controller state calculation expression, and writing the calculation results into the component writing variables and the controller writing variable; and (ii) an updating function for updating the component reading variables and the controller reading variable into the calculation results.

In one embodiment of the invention, the cycle accurate model generation section calculates the states of the components and the state of the controller from the reading variables using the calculation functions, writes the calculation results into the component writing variables and the controller writing variable, and updates the component reading variables and the controller reading variable into the calculation results using the updating function.

In one embodiment of the invention, the plurality of components include a register. The component state calculation expressions include a register state calculation expression for calculating the state of the register.

In one embodiment of the invention, the component reading variable include a register reading variable indicating a variable which is read from the register; the component writing variables include a register writing variable indicating a variable which is written into the register; the component reading variable storage areas include a register reading variable storage area for storing the register reading variable; and the component writing variable storage areas include a register writing variable storage area for storing the register writing variable.

In one embodiment of the invention, the calculation function includes a function for calculating the state of the register from the reading variables using the register state calculation expression, and writing the calculation result into the register writing variable. The updating function includes a function for updating the register reading variable into the calculation result.

In one embodiment of the invention, the plurality of components include a memory device. The cycle accurate model generation section calculates a state of the memory device from the reading variables.

In one embodiment of the invention, the component state calculation expressions include a memory device state calculation expression for calculating the state of the memory device.

In one embodiment of the invention, the component reading variables include a memory device reading variable indicating a variable which is read from the memory device; the component writing variables include a memory device writing variable indicating a variable which is written into the memory device; the component reading variable storage areas include a memory device reading variable storage area for storing the memory device reading variable; and the component writing variable storage areas include a memory device writing variable storage area for storing the memory device writing variable.

In one embodiment of the invention, the calculation function includes a function for calculating the state of the memory device from the reading variables using the memory device state calculation expression, and writing the calculation result into the memory device writing variable. The updating function includes a function for updating the memory device reading variable into the calculation result.

In one embodiment of the invention, the cycle accurate model generation section calculates the state of the memory device from the reading variables using the calculation function, writes the calculation result into the memory device writing variable, and updates the memory device reading variable into the calculation result using the updating function.

In one embodiment of the invention, the memory device includes a plurality of elements. The cycle accurate model generation section updates an element for which the calculation has been performed and does not update an element for which the calculation has not been performed regarding the state of the memory device.

In one embodiment of the invention, when an identical calculation is to be performed in repetition, and the calculation has been already performed, the result of the calculation which has been performed is used without repeating the same calculation.

According to another aspect of the invention, a method for generating a model for verifying hardware including a plurality of components and a controller for controlling the plurality of components is provided. The method includes the steps of performing high level synthesis of the hardware; and generating a cycle accurate model, capable of verifying a state of at least one of the plurality of components and the controller at a cycle accurate level with a general-purpose programming language.

In one embodiment of the invention, the step of generating the cycle accurate model includes the step of generating the cycle accurate model based on (i) operation information on the plurality of components, (ii) connection information which represents at least one of a connection between a component and another component among the plurality of components and a connection between one of the plurality of components and the controller, and (iii) controller information which represents a state transition of the controller.

In one embodiment of the invention, the step of generating the cycle accurate model includes the step of generating component state calculation expressions for calculating states of the plurality of components and a controller state calculation expression for calculating a state of the controller with the general-purpose programming language based on the operation information, the connection information, and the controller information.

In one embodiment of the invention, the step of generating the cycle accurate model includes the step of setting reading variables and writing variables, and setting reading variable storage areas for storing the reading variables and writing variable storage areas for storing the writing variables.

In one embodiment of the invention, the reading variables include component reading variables indicating variables which are read from the plurality of components and a controller reading variable indicating a variable which is read from the controller; the writing variables include component writing variables indicating variables which are to be written into the plurality of components and a controller writing variable indicating a variable which is to be written into the controller; the reading variable storage areas include component reading variable storage areas for storing the component reading variables, and a controller reading variable storage area for storing the controller reading variable; and the writing variable storage areas include component writing variable storage areas for storing the component writing variables, and a controller writing variable storage area for storing the controller writing variable.

In one embodiment of the invention, the step of generating the cycle accurate model includes the step of generating, with the general-purpose programming language, (i) a calculation function for calculating the states of the components and the state of the controller from the reading variables using the component state calculation expressions and the controller state calculation expression, and writing the calculation results into the component writing variables and the controller writing variable; and (ii) an updating function for updating the component reading variables and the controller reading variable into the calculation results.

In one embodiment of the invention, the plurality of components include a register. The component state calculation expressions include a register state calculation expression for calculating the state of the register.

In one embodiment of the invention, the component reading variables include a register reading variable indicating a variable which is read from the register; the component writing variables include a register writing variable indicating a variable which is written into the register; the component reading variable storage areas include a register reading variable storage area for storing the register reading variable; and the component writing variable storage areas include a register writing variable storage area for storing the register writing variable.

In one embodiment of the invention, the calculation function includes a function for calculating the state of the register from the reading variables using the register state calculation expression, and writing the calculation result into the register writing variable. The update function includes a function for updating the register reading variable into the calculation result.

In one embodiment of the invention, the plurality of components include a memory device. The component state calculation expressions include a memory device state calculation expression for calculating a state of the memory device.

In one embodiment of the invention, the component reading variables include a memory device reading variable indicating a variable which is read from the memory device; the component writing variables include a memory device writing variable indicating a variable which is written into the memory device; the component reading variable storage areas include a memory device reading variable storage area for storing the memory device reading variable; and the component writing variable storage areas include a memory device writing variable storage area for storing the memory device writing variable.

In one embodiment of the invention, the calculation function includes a function for calculating the state of the memory device from the reading variables using the memory device state calculation expression, and writing the calculation result into the memory device writing variable. The updating function includes a function for updating the memory device reading variable into the calculation result.

According to still another aspect of the invention, a control program causes a computer to execute the steps of performing high level synthesis of hardware including a plurality of components and a controller for controlling the plurality of components; and generating a cycle accurate model, capable of verifying a state of at least one of the plurality of components and the controller at a cycle accurate level with a general-purpose programming language.

According to still another aspect of the invention, a readable recording medium has a control program recorded thereon for causing a computer to execute the steps of performing high level synthesis of hardware including a plurality of components and a controller for controlling the plurality of components; and generating a cycle accurate model, capable of verifying a state of at least one of the plurality of components and the controller at a cycle accurate level with a general-purpose programming language.

According to still another aspect of the invention, a method for verifying hardware including a plurality of components and a controller for controlling the plurality of components is provided. The method comprising the steps of performing high level synthesis of the hardware; generating a cycle accurate model, capable of verifying a state of at least one of the plurality of components and the controller at a cycle accurate level with a general-purpose programming language; and verifying the hardware using the cycle accurate model.

In one embodiment of the invention, the step of generating the cycle accurate model includes the step of generating the cycle accurate model based on (i) operation information on the plurality of components, (ii) connection information which represents at least one of a connection between a component and another component among the plurality of components and a connection between one of the plurality of components and the controller, and (iii) controller information which represents a state transition of the controller.

In one embodiment of the invention, the step of generating the cycle accurate model includes the step of generating component state calculation expressions for calculating states of the plurality of components and a controller state calculation expression for calculating a state of the controller with the general-purpose programming language based on the operation information, the connection information, and the controller information.

In one embodiment of the invention, the step of generating the cycle accurate model includes the step of setting reading variables and writing variables, and setting reading variable storage areas for storing the reading variables and writing variable storage areas for storing the writing variables.

In one embodiment of the invention, the reading variables include component reading variables indicating variables which are read from the plurality of components and a controller reading variable indicating a variable which is read from the controller; the writing variables includes component writing variables indicating variables which are to be written into the plurality of components and a controller writing variable indicating a variable which is to be written into the controller; the reading variable storage areas include component reading variable storage areas for storing the component reading variables, and controller reading variable storage areas for storing the controller reading variables; and the writing variable storage areas include a component writing variable storage areas for storing the component writing variables, and a controller writing variable storage area for storing the controller writing variable.

In one embodiment of the invention, the step of generating the cycle accurate model includes the step of generating, with the general-purpose programming language, (i) a calculation function for calculating the states of the components and the state of the controller from the reading variables using the component state calculation expressions and the controller state calculation expression, and writing the calculation results into the component writing variables and the controller writing variable; and (ii) an updating function for updating the component reading variables and the controller reading variable into the calculation results.

In one embodiment of the invention, the step of verifying includes the step of calculating the states of the components and the state of the controller from the reading variables using the calculation function, writes the calculation results into the component writing variables and the controller writing variable, and updates the component reading variables and the controller reading variable into the calculation results using the updating function.

In one embodiment of the invention, the plurality of components include a register. The component state calculation expressions include a register state calculation expression for calculating the state of the register.

In one embodiment of the invention, the component reading variables include a register reading variable indicating a variable which is read from the register; the component writing variable include a register writing variable indicating a variable which is written into the register; the component reading variable storage areas include a register reading variable storage area for storing the register reading variable; and the component writing variable storage areas include a register writing variable storage area for storing the register writing variable.

In one embodiment of the invention, the calculation function includes a function for calculating the state of the register from the reading variables using the register state calculation expression, and writing the calculation result into the register writing variable. The updating function includes a function for updating the register reading variable into the calculation result.

In one embodiment of the invention, the step of verifying includes the step of calculating the state of the register from the reading variables using the calculation function, writes the calculation result into the register writing variable, and updates the register reading variable into the calculation result using the updating function.

In one embodiment of the invention, the plurality of components include a memory device. The component state calculation expressions include a memory device state calculation expression for calculating the state of the memory device.

In one embodiment of the invention, the component reading variables include a memory device reading variable indicating a variable which is read from the memory device; the component writing variables include a memory device writing variable indicating a variable which is written into the memory device; the component reading variable storage areas include a memory device reading variable storage area for storing the memory device reading variable; and the component writing variable storage areas include a memory device writing variable storage area for storing the memory device writing variable.

In one embodiment of the invention, the calculation function includes a function for calculating the state of the memory device from the reading variables using the memory device state calculation expression, and writing the calculation result into the memory device writing variable. The updating function includes a function for updating the memory device reading variable into the calculation result.

In one embodiment of the invention, the step of verifying includes the step of calculating the state of the memory device from the reading variables using the calculation function, writing the calculation result into the memory device writing variable, and updating the memory device reading variable into the calculation result using the updating function.

In one embodiment of the invention, the step of verifying includes the step of updating an element for which the calculation has been performed and not updating an element for which the calculation has not been performed regarding the state of the memory device.

In one embodiment of the invention, the step of verifying includes the step of, when an identical calculation is to be performed in repetition, and the calculation has been already performed, using the result of the calculation which has been performed without repeating the same calculation.

According to still another aspect of the invention, a control program causes a computer to execute the steps of performing high level synthesis of hardware including a plurality of components and a controller for controlling the plurality of components; generating a cycle accurate model, capable of verifying a state of at least one of the plurality of components and the controller at a cycle accurate level with a general-purpose programming language; and verifying the hardware using the cycle accurate model.

According to still another aspect of the invention, a readable writing medium has a control program recorded thereon for causing a computer to execute the steps of performing high level synthesis of hardware including a plurality of components and a controller for controlling the plurality of components; generating a cycle accurate model, capable of verifying a state of at least one of the plurality of components and the controller at a cycle accurate level with a general-purpose programming language; and verifying the hardware using the cycle accurate model.

According to the present invention, the high level synthesis device analyzes an operation description of a hardware operation (for example, a behavior description) and performs high level synthesis of the hardware based on the analysis result. As a result of the high level synthesis, calculation expressions for calculating states of the plurality of components (for example, registers) and a calculation expression for calculating a state of the controller are created with a general-purpose programming language. The calculation expressions are generated based on (i) component operation information on a plurality of components such as an arithmetic operator, a register or the like assigned to the above-mentioned operation description, (ii) controller state transition information on the controller for controlling the plurality of components; and (iii) connection information indicating at least one of a connection between a component and another component among the plurality of components and a connection between one of the plurality of components and the controller.

In the case where a high level programming language such as the C language or the like is used as the general-purpose programming language, successive processing is performed. Therefore, it is necessary to match time-wise the processing cycle of the program and the verification cycle.

However, since a variable is processed on a cycle unit, a pre-processing variable (corresponding to the variable which is read) is different from a post-processing variable (corresponding to the variable which is written).

In the case where the hardware includes a plurality of registers and the registers operate with reference to mutual values, when order of calculation of data input to the registers is changed, an accurate value may not be generated.

For example, when register 1 refers to a value stored in register 2 and register 2 refers to a value stored in register 1, the calculation result may be different between case (1) and (2). Case (1): the operation of register 1 is calculated, and then the operation of register 2 is calculated. Case (2): the operation of register 2 is calculated, and then the operation of register 1 is calculated.

In order to solve the problem, according to the present invention, writing variables and reading variables, writing variable storage areas for storing the writing variables, and reading variable storage areas for storing the reading variables are set. Then, the following steps are performed sequentially: (i) a calculation step of calculating data which is input to a component (for example, a register) of an actual hardware device using a calculation expression after performing an arithmetic operation in the hardware device in one clock cycle using reading variables, and storing the calculation result in writing variable storage areas such as a buffer, a register or the like as a writing variable; and (ii) an updating step of storing the calculation result, stored as the writing variable, in reading variable storage areas such as a buffer, a register or the like as a reading variable. Thus, a simulation of the hardware in one clock cycle is performed.

In the case where a memory device such as a RAM or the like is included as a component, a calculation expression for calculating a state of the memory device is created with a general-purpose programming language, like the case of the register. In this manner, hardware including a memory device such as a RAM or the like can be verified at a cycle accurate level.

According to the present invention, the performance of hardware can be verified at high speed, without using a slow-operating and expensive HDL simulator required in the prior art. A cycle accurate model for the verification is described with a general-purpose programming language, and thus can be combined with an part of software other than a part for simulating hardware. Thus, hardware/software association can be designed easily. Since a hardware operation can be described at a clock cycle unit, the simulation can be performed for an arbitrary number of clock cycles or the simulation can be stopped at an arbitrary timing. This is effective for debugging the hardware.

In the case where input data is calculated for a memory device including a plurality of elements such as a RAM and the like, when the memory device does not allow multiple inputs and the calculation is performed for only one element in one clock cycle, the variable to be stored can be updated only for the calculated element. Thus, the variable once calculated can be set not to be updated until it is calculated the next time, which increase the efficiency.

In the case where the same calculation is to be performed in repetition for a plurality of variables in one clock cycle, the same calculation can be prevented from being repeated as follows. The variable which has been calculated in the current clock cycle is stored, and the stored value is used for a different variable. Thus, the processing efficiency is improved. This is especially effective when there are plurality of similar processing routes.

Thus, the invention described herein makes possible the advantages of providing a high level synthesis device for generating a cycle accurate model, for verifying hardware at a clock cycle unit without using an HDL simulator, with a general-purpose programming language; a method for generating such a cycle accurate model; a method for verifying hardware using such a cycle accurate model; a control program for causing a computer to execute such a method; and a readable recording medium having such a control program recorded thereon.

These and other advantages of the present invention will become apparent to those skilled in the art upon reading and understanding the following detailed description with reference to the accompanying figures.

BRIEF DESCRIPTION OF THE DRAWINGS

FIG. 4 is a schematic diagram illustrating an example of component operation information on the circuit shown in FIG. 3;

FIG. 10 shows a description which defines a constant described with the C language for representing the state of the controller of the circuit shown in FIG. 3;

FIG. 11 shows a description which indicates a register state calculation expression for calculating the state of the register R of the circuit shown in FIG. 3;

FIG. 12 shows a description which represents a calculation expression for executing a calculation of an arithmetic operation in the circuit shown in FIG. 3 as a function of the C language;

FIG. 13 shows a description which represents a calculation expression for calculating the value which is output from the controller of the circuit shown in FIG. 3;

FIG. 14 shows a description which represents a controller state calculation expression for calculating the state of the controller of the circuit shown in FIG. 3;

FIG. 15 show a description which represents processing of a calculation step performed for the circuit shown in FIG. 3;

FIG. 16 shows a description which represents processing of an updating step performed for the circuit shown in FIG. 3;

FIG. 18 shows a VHDL description which represents an operation model of a memory of the circuit shown in FIG. 17;

FIG. 19 shows a description which represents processing of a calculation step performed for the circuit shown in FIG. 17;

FIG. 20 shows a description which represents processing of an updating step performed for the circuit shown in FIG. 17;

FIG. 21 shows a description which represents exemplary processing of an updating step performed for the circuit shown in FIG. 17 for improving the efficiency;

FIG. 23 shows a description which represents processing of a calculation step performed for a register included in block 2 in the circuit shown in FIG. 22;

FIG. 24 shows a description which represents processing of a calculation step performed for a register included in block 3 in the circuit shown in FIG. 22; and FIG. 25 shows a description which represents exemplary processing for preventing calculations from being performed in repetition for the circuit shown in FIG. 22.

DESCRIPTION OF THE PREFERRED EMBODIMENTS

Hereinafter, the present invention will be described by way of illustrative examples with reference to the accompanying drawings.

A high level synthesis device according to the present invention will be described with reference to the figures.

High level synthesis of hardware refers to a technology for generating a logic circuit of, for example, RTL (Register Transfer Level) from an operation description, which does not include information regarding a structure of the hardware and has only a processing operation described therein, using a computer system through a simulation. Techniques of high level synthesis are described in detail in, for example, "High-Level Synthesis" (Kluwer Academic Publishers) and Japanese Laid-Open Publication No. 5-101141. Herein, a basic operation of high level synthesis will be described.

In high level synthesis described in first through third examples, parallel operations of circuits can be described. Also in the first through third examples, the C language will be used as an exemplary general-purpose programming language.

EXAMPLE 1

Figure 1:
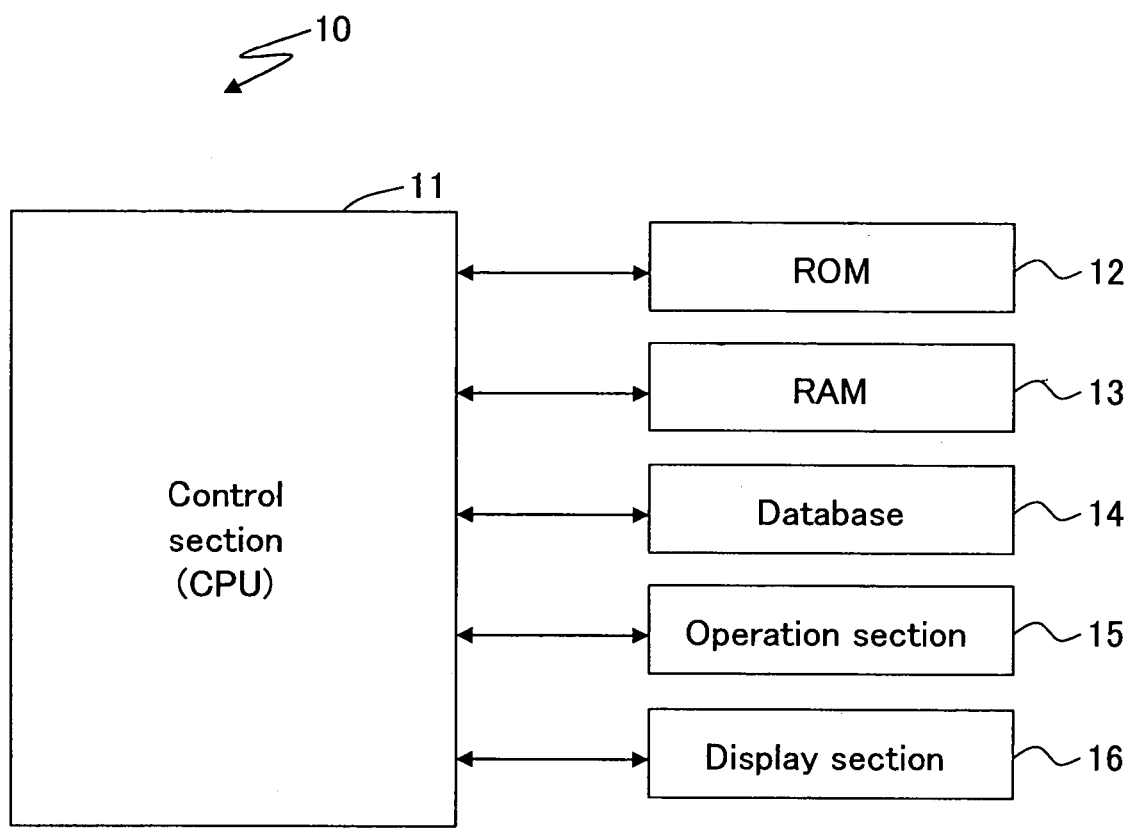
FIG. 1 is a schematic block diagram illustrating a structure of a high level synthesis device according to an example of the present invention.

FIG. 1 is a schematic block diagram illustrating a high level synthesis device 10 according to the first example of the present invention.

The high level synthesis device 10 includes a computer system. In more detail, the high level synthesis device 10 includes a control section 11 for executing a control program, a ROM 12 having the control program and data thereof recorded therein, a RAM 13 acting as a work memory when the control section 11 performs a control operation, a database 14 having various data required for circuit design and information representing the results of various operations (e.g., controller information, data path information) recorded therein, an operation section 15 for allowing a user to input an operation instruction, and a display section 16 for displaying various images.

The control section 11 controls the ROM 12, the RAM 13, the database 14, the operation section 15, and the display section 16.

The control section 11 analyzes an operation description having an operation of the hardware described therein. Then, the control section 11 synthesizes a circuit indicating desired hardware of, for example, RTL (Register Transfer Level) by a simulation, from the analysis result of the operation description. For the synthesis, a control data flow graph formed of nodes representing arithmetic operations and input and output branches representing the flow of data are used. The control program and data thereof may be installed to the ROM 12 from a readable recording medium such as a floppy disc, an optical disc (e.g., a compact disc) or the like. The operation description may be input from the operation section 15 or installed to the ROM 12 from a readable recording medium such as a floppy disc, an optical disc (e.g., a compact disc) or the like. Alternatively, the operation description may be stored in advance in the database 14.

The control section 11 is formed of a CPU (Central Processing Unit). The control section 11 appropriately controls the ROM 12, the RAM 13, the database 14, the operation section 15 and the display section 16 based on the control program, so as to perform high level synthesis of hardware.

Hereinafter, the high level synthesis device 10 will be described by way of functions thereof.

Figure 2:
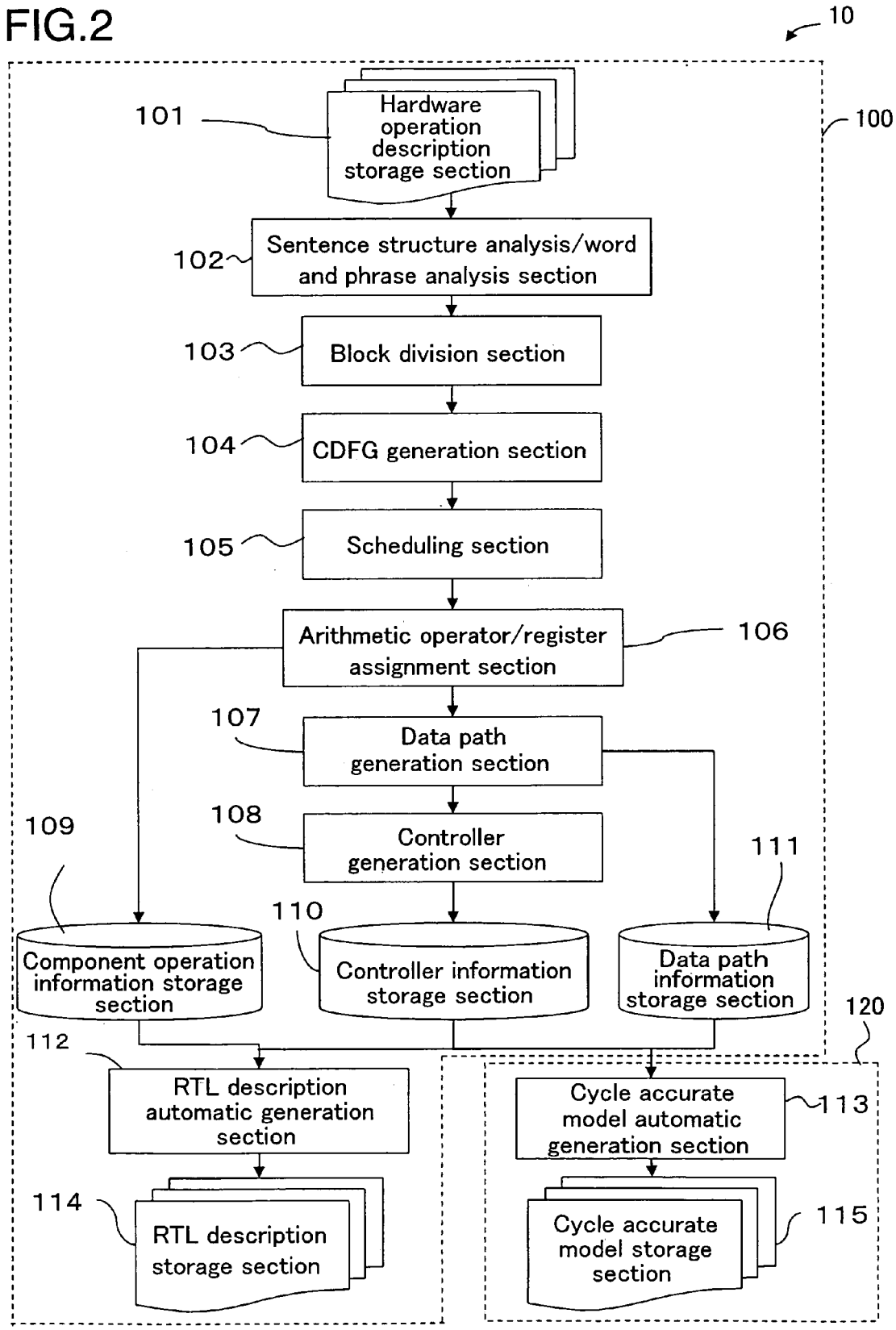
FIG. 2 is a schematic block diagram illustrating functions of a high level synthesis device according to an example of the present invention.

FIG. 2 is a schematic block diagram functionally illustrating the high level synthesis device 10 according to the first example.

As shown in FIG. 2, the high level synthesis device 10 includes a high level synthesis section 100 for performing high level synthesis of hardware, and a cycle accurate model generation section 120. The cycle accurate model generation section 120 generates a cycle accurate model which is capable of verifying the hardware obtained by the high level synthesis performed by the high level synthesis section 100 at a cycle accurate level, and then verifies the hardware using the cycle accurate model.

The high level synthesis section 100 includes a hardware operation description storage section 101, a sentence structure analysis/word and phrase analysis section 102, a block division section 103, a CDFG (Control Data Flow Graph) generation section 104, a scheduling section 105, an arithmetic operator/register assignment section 106, a data path generation section 107, a controller generation section 108, an RTL description automatic generation section 112, and an RTL description storage section 114.

The cycle accurate model generation section 120 includes a cycle accurate model automatic generation section 113 for automatically generating a cycle accurate model, and a cycle accurate model storage section 115 for storing the cycle accurate model automatically generated by the cycle accurate model automatic generation section 113.

The high level synthesis device 10 in this example operates as follows.

An operation description stored in the hardware operation description storage section 101 is analyzed by the sentence structure analysis/word and phrase analysis section 102, and then is divided into a plurality of blocks by the block division section 103 in accordance with the description of parallel operations.

Then, the CDFG generation section 104 generates a control data flow graph (CDFG) which is formed of nodes representing arithmetic operations and input and output branches representing the flow of data, for each of the plurality of blocks.

The scheduling section 105 performs scheduling for each node of the CDFG.

The arithmetic operator/register assignment section 106 is one form of a component assignment section. The arithmetic operator/register assignment section 106 assigns a plurality of components such as an arithmetic operation, a register or the like to each node which has been scheduled. Thus, the arithmetic operator/register assignment section 106 generates component operation information. The component operation information which is generated by the arithmetic operator/register assignment section 106 is stored in a component operation information storage section 109.

Next, the data path generation section 107 generates data path information on the hardware as connection information. The data path generation section 107 generates the information based on at least one of (i) a connection between one component and another component among the plurality of components assigned by the arithmetic operator/register assignment section 106 (for example, operators, registers, etc.) and (ii) a connection between one of the plurality of components and the controller for controlling the components. The data path information generated by the data path generation section 107 is stored in a data path information storage section 111.

The controller generation section 108 generates a controller circuit for each block and also generates controller information including information regarding a state transition of the controller circuit. The controller information generated by the controller generation section 108 is stored in a controller information storage section 110.

The RTL description automatic generation section 112 automatically generates an RTL description from the component operation information stored in the component operation information storage section 109, the controller information stored in the controller information storage section 110, and the data path information stored in the data path information storage section 111. The RTL description generated by the RTL description automatic generation section 112 is stored in the RTL description storage section 114.

The cycle accurate model automatic generation section 113 automatically generates a general-purpose programming language model, which is capable of simulating the hardware obtained by the high level synthesis performed by the high level synthesis section 100 at a cycle accurate level, as a cycle accurate model. The cycle accurate model generated by the cycle accurate model automatic generation section 113 is stored in a cycle accurate model storage section 115.

One feature of the high level synthesis device 100 according to the first example is that the cycle accurate model automatic generation section 113 is provided. When a hardware device such as, for example, an LSI is generated by high level synthesis, the cycle accurate model generated by the cycle accurate model automatic generation section 113 can check the simulation or debugging at a clock cycle unit. The cycle accurate model is described with a general-purpose programming language, and can verify each part of the hardware device accurately, for example, the RTL level and at high speed.

Hereinafter, the cycle accurate model automatic generation section 113 and the cycle accurate model storage section 115 will be described in more detail.

Figure 3:
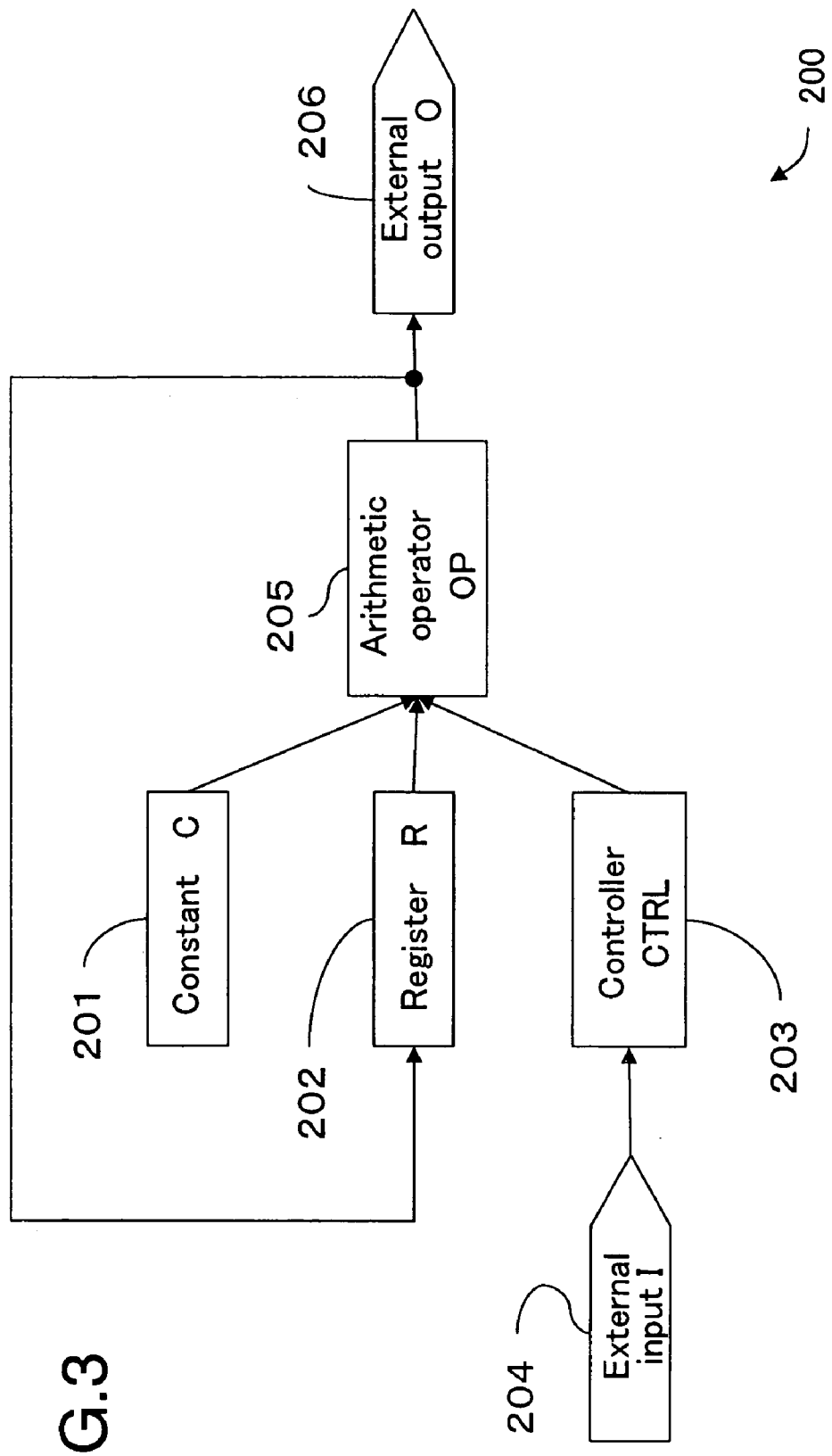
FIG. 3 is a schematic circuit diagram illustrating a circuit for which a cycle accurate model is to be generated by a cycle accurate model automatic generation section according to a first example of the present invention.

FIG. 3 is a schematic circuit diagram illustrating a circuit 200 for which a cycle accurate model is to be generated by the cycle accurate model automatic generation section 113 in the first example.

The circuit 200 includes one constant 201, one register 202, one controller 203, one external input port 204, one arithmetic operator 205, and one external output port 206. In FIG. 3, the constant 201 is represented by "C", the register 202 is represented with "R", the controller 203 is represented with "CTRL", the arithmetic operator 205 is represented with "OP", the external input port 204 is represented with "I", and the external output port 206 is represented with "O".

The circuit 200 operates as follows. The value of the constant 201 and the value of the register 202 are input to the arithmetic operator 205. The arithmetic operator 205 performs an arithmetic operation using the value of the constant 201 and the value of the register 202. The result of the arithmetic operation performed by the arithmetic operator 205 is output from the external output port 206 and also stored in the register 202. The arithmetic operator 205 is controlled by the controller 203. The state of the controller 203 is controlled by the value of the external input port 204.

FIG. 4 is a schematic diagram illustrating an example of component operation information on the circuit 200 shown in FIG. 3. The component operation information is stored in the component operation information storage section 109 shown in FIG. 2. In FIG. 4, operation information on the constant 201, the register 202 and the arithmetic operator 205 shown in FIG. 3 is shown as the component operation information.

As shown in FIG. 4, the component operation information contains information on an input port and/or an output port of each of a plurality of components. In this example, information on an output port O1 of the constant C, information on an input port I1 and an output port O1 of the register R, and information on input ports I1, I2 and I3 and an output port O1 of the arithmetic operator OP are contained.

When the value of the input port I3 is "0", the arithmetic operator OP adds the value of the input port I1 and the value of the input port I2. When the value of the input port I3 is "1", the arithmetic operator OP subtracts the value of the input port I2 from the value of the input port I1.

Figure 5:
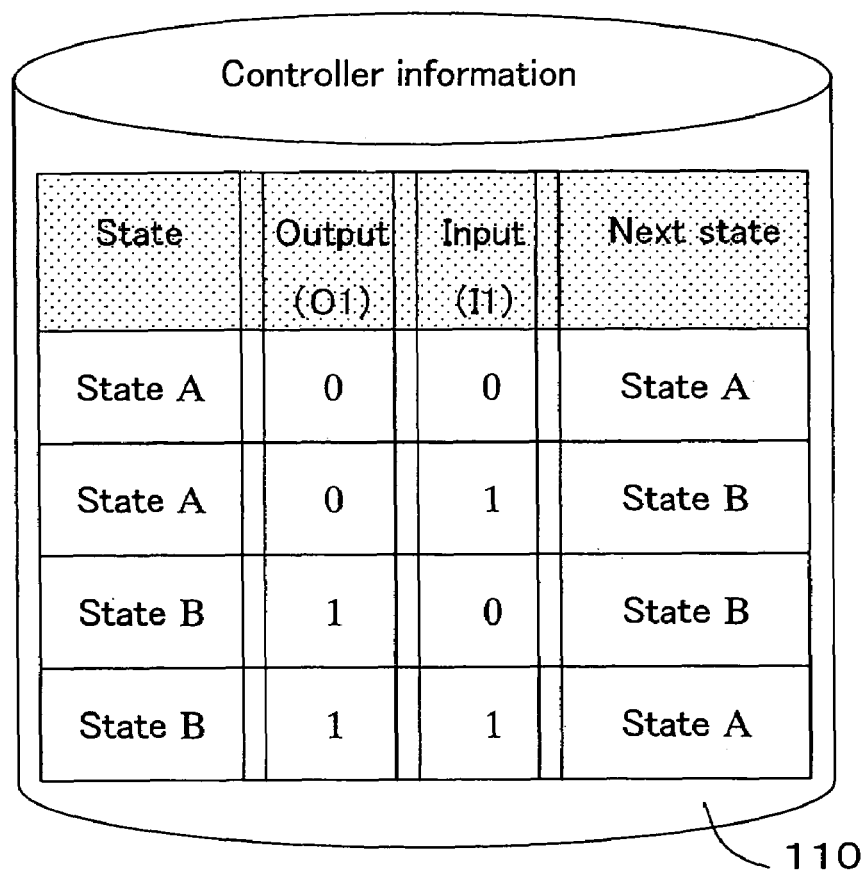
FIG. 5 is a schematic diagram illustrating an example of controller information on the circuit shown in FIG. 3.

FIG. 5 is a schematic diagram illustrating an example of controller information on the circuit 200 shown in FIG. 3. The controller information is stored in the controller information storage section 110 shown in FIG. 2. In FIG. 5, controller information on the controller 203 (FIG. 3) is shown as the controller information.

As shown in FIG. 5, the controller 203 has two states of "state A" and "state B".

In "state A", the controller 203 outputs "0"; and in "state B", the controller 203 outputs "1".

When the value of input to the controller 203 is "0", the state of the controller 203 is maintained. When the value of input to the controller 203 is "1", the state of the controller 203 is changed.

Figure 6:
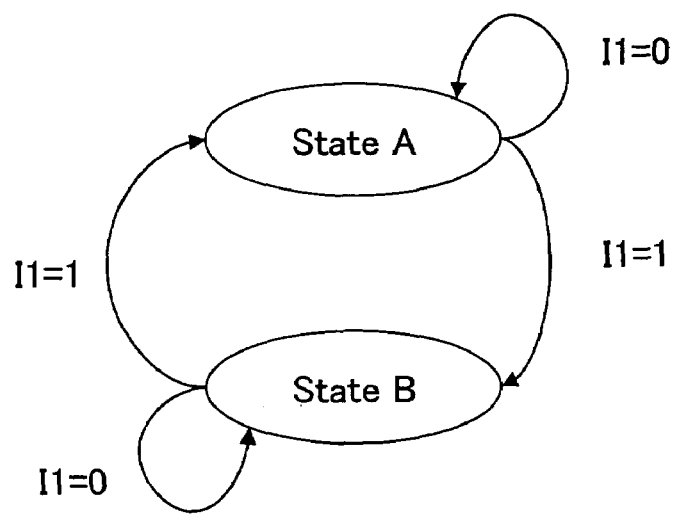
FIG. 6 is a schematic diagram illustrating transition of the state of the controller in accordance with the value of an input.

FIG. 6 is a schematic diagram illustrating the state transition of the controller 203 in accordance with the value of input.

Figures 7, 8, 9:
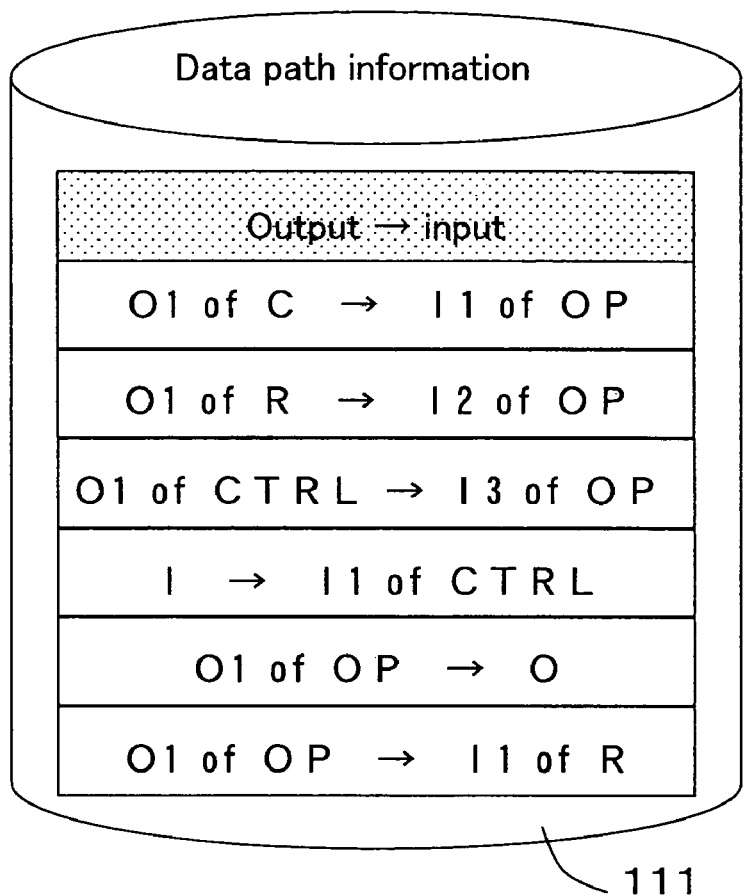
FIG. 7 is a schematic diagram illustrating an example of data path information on the circuit shown in FIG. 3.
FIG. 8 shows a description which represents a register reading variable and a register writing variable of a register R of the circuit shown in FIG. 3 as variables in the C language.
FIG. 9 shows a description which represents a controller reading variable and a controller writing variable of a controller of the circuit shown in FIG. 3 as variables in the C language.

FIG. 7 is a schematic diagram illustrating an example of data path information on the circuit 200 shown in FIG. 3. The data path information is stored in the data path information storage section 111 shown in FIG. 2. The data path information contains data path information on a data path between one component and another component, and also data path information on a data path between the controller and the components.

As shown in FIG. 7, for example, the value of the output port O1 of the constant C is input to the input port I1 of the arithmetic operator OP. The value of the output port O1 of the register R is input to the input port I2 of the arithmetic operator OP. The value of the output port O1 of the controller CTRL is input to the input port I3 of the arithmetic operator OP.

The value of the external input port I is input to the input port I1 of the controller CTRL. The value of the output port O1 of the arithmetic operator OP is input to the external output port O and also to the input port I1 of the register R.

Hereinafter, a procedure of cycle accurate model generation processing for automatically generating a cycle accurate model with a general-purpose programming language will be described. The cycle accurate model is generated based on the component operation information shown in FIG. 4, the controller information shown in FIG. 5, and the data path information shown in FIG. 7. The cycle accurate model is capable of simulating the circuit 200 at a cycle accurate level.

First, information regarding the register R of the circuit 200 is extracted from the component operation information which is stored in the component operation information storage section 109.

Next, in order to calculate the state of the register R, a register reading variable and a register writing variable are set, and a register reading variable storage area for storing the register reading variable and a register writing variable storage area for storing the register writing variable are set in a buffer or a register. As the buffer or the register, the RAM 13 (FIG. 1) may be used or a separate buffer or register may be provided.

FIG. 8 shows a description which represents a register reading variable and a register writing variable of the register R of the circuit 200 (FIG. 3) as variables in the C language. Here, the register reading variable is represented as R_rdata, and the register writing variable is represented as R_wdata.

The reading variable R_rdata indicates the state of the register R at a clock cycle for which a simulation is to be performed. The writing variable R_wdata indicates the state of the register R at a clock cycle which is next to the clock cycle for which a simulation is to be performed.

Next, in order to calculate the state of the controller CTRL, a controller reading variable and a controller writing variable are set, and a controller reading variable storage area for storing the controller reading variable and a controller writing variable storage area for storing the controller writing variable are set in a buffer or a register in substantially the same manner as described above.

FIG. 9 shows a description which represents a controller reading variable and a controller writing variable of the controller CTRL of the circuit 200 (FIG. 3) as variables in the C language. Here, the controller reading variable is represented as cSTATE, and the controller writing variable is represented as nSTATE.

The controller reading variable CSTATE indicates the state of the controller CTRL at a clock cycle for which a simulation is to be performed. The controller writing variable nSTATE indicates the state of the controller CTRL at a clock cycle which is next to the clock cycle for which a simulation is to be performed.

Next, a constant representing each state of the controller 203 is prepared. According to the controller information stored in the controller information storage section 110 shown in FIG. 5, the state of the controller CTRL is "state A" or "state B".

FIG. 10 shows a description which defines a constant described with the C language for representing the state of the controller 203. As shown in FIG. 10, "state A" is represented as STATE_A, and "state B" is represented as STATE_B.

Next, a calculation expression for calculating the register writing variable R_wdata of the register R (register 202) in the next clock cycle is created.

FIG. 11 shows a description which indicates a register state calculation expression for calculating the state of the register R of the circuit 200 shown in FIG. 3. FIG. 11 shows an exemplary calculation expression for calculating the writing variable R_wdata of the register R.

According to the data path information stored in the data path information storage section 111 shown in FIG. 7, the input of the register R is connected to the output of the arithmetic operator OP (arithmetic operator 205). An arithmetic operation performed by the arithmetic operator OP is represented as function execOP( ). The arithmetic operation is performed by the arithmetic operator OP in accordance with the constant C, the register reading variable R_rdata, and the input value CTRL_O1 from the controller CTRL (controller 203).

According to the component operation information stored in the component operation information storage section 109 shown in FIG. 4, the arithmetic operator OP adds the value of the input port I1 and the value of the input port I2 when the value of the input port I3 is "0", and subtracts the value of the input port I2 from the value of the input port I1 when the value of the input port I3 is "1".

FIG. 12 shows a description which represents a calculation expression for executing a calculation of the arithmetic operation OP in the circuit 200 as a function of the C language.

In the example shown in FIG. 12, the values of the input ports I1, I2 and I3 of the arithmetic operator OP are respectively set to arguments input1, input2, and input3. When the value of the input port I3 is neither "0" or "1", an error processing function error( ) is executed.

According to the data path information stored in the data path information storage section 111 shown in FIG. 7, the input port I1 of the arithmetic operator OP is connected to the output of the constant C, and the input port I2 of the arithmetic operator OP is connected to the output of the register R. The input port I3 of the arithmetic operator OP is connected to the output of the controller CTRL.

Accordingly, in the calculation expression for calculating the register writing variable R_wdata of the register R shown in FIG. 11, the following values are substituted for arguments of the function execOP( ) for performing the calculation of the arithmetic operator OP. The value of the constant C is substituted for input1, the register reading variable R_rdata is substituted for input2, and the value of CTRL_O1 representing the value of the output of the controller CTRL is substituted for input 3.

Next, a calculation expression for calculating the controller writing variable nSTATE, which shows the next state of the controller CTRL, is created.

According to the controller information stored in the controller information storage section 110 shown in FIG. 5, the value which is output from the controller CTRL (controller 203) is "0" when the state of the controller CTRL is "state A", and is "1" when the state of the controller CTRL is "state B".

FIG. 13 shows a description which represents a calculation expression for calculating the value which is output from the controller 203 of the circuit 200 shown in FIG. 3. The output CTRL_O1 of the controller CTRL can be represented by an expression shown in FIG. 13.

According to the controller information shown in FIG. 5, the controller CTRL maintains the state when the value of the input port I1 is "0", and changes the state when the value of the input port I1 is "1". According to the data path information shown in FIG. 7, the value of the input port I1 of the controller CTRL is the value of the external input port I. Based on these conditions, the calculation expression for calculating the next state of the controller CTRL can be represented.

FIG. 14 shows a description which represents a controller state calculation expression for calculating the state of the controller CTRL (controller 203) of the circuit 200 shown in FIG. 3.

In the controller state calculation expression shown in FIG. 14, when the value of the input port I1 of the controller CTRL is neither "0" or "1", an error processing function error( ) is executed.

Next, a calculation function for executing the calculation expression for calculating the state of the register R (register writing variable R_wdata) and the calculation expression for calculating the state of controller CTRL (controller writing variable nSTATE) is created. In a hardware simulation, this calculation function is executed to perform the following calculation step. The state of the register R and the state of the controller CTRL are calculated using the reading variables, and the calculation results are stored in the writing variables.

FIG. 15 shows a description which represents processing of the calculation step performed for the circuit 200 shown in FIG. 3.

FIG. 15 shows calculate_circuit( ), which is an example of a calculation function for executing the calculation expression for calculating the state of the register R and the calculation expression for calculating the state of the calculator CTRL. Here, the register state calculation expression for calculating the state of the register R shown in FIG. 11, and the controller state calculation expression for calculating the state of the controller shown in FIG. 14, are executed.

In the function calculate_circuit( ), the order of execution of the calculation expression for calculating the state of the register R, and the calculation expression for calculating the state of the calculator CTRL, may be changed. The reason is that respective calculation expressions are executed using the register reading variable R_rdata and the controller reading variable cSTATE, and these values are not changed in the function calculate_circuit( ).

Since the calculation result is not changed even when the order of execution of the calculation expressions is changed, the order of execution may be changed. As a result, it is not necessary to determine the order of hardware components to be calculated when generating a general-purpose programming language model, which is capable of simulating hardware at a cycle accurate level using a successive processing system language such as the C language or the like. This improves the efficiency of processing.

Next, an updating function for updating the reading variables is created. In a hardware simulation, this updating function is executed to perform the following updating step. Each reading variable is updated into the result of the calculation performed in the calculation step (i.e., the value of the writing variable).

FIG. 16 shows a description which represents updating processing performed for the circuit 200 shown in FIG. 3.

FIG. 16 shows update_circuit( ), which is an example of an updating function for updating the results of execution of the calculation expression for the register R and the calculation expression for the calculator CTRL to respective reading variables. Here, the value of the register writing variable R_wdata is substituted for the register reading variable R_rdata. The state of the controller writing variable nSTATE is substituted for the controller reading variable sSTATE.

In this manner, a cycle accurate model can be generated as a general-purpose programming language model which is capable of simulating the circuit 200 (FIG. 3) at a cycle accurate level.

As described above, according to the cycle accurate model generated in the first example, the calculation function calculate_circuit( ) shown in FIG. 15 is executed to perform the calculation step, and then the updating function update_circuit( ) shown in FIG. 16 is executed to perform the updating step. Thus, one clock cycle of operation of the circuit 200 shown in FIG. 3 can be simulated.

Since the state of the register R, the state of the controller CTRL and the like are stored as variables, these states can be verified at an arbitrary cycle. For example, when some discrepancy occurs in a certain clock cycle while debugging hardware, the cause of the discrepancy can be found as follows. Using the cycle accurate model generated in this example, simulation is performed up to that clock cycle, and the state of the register R and the state of the controller CTRL are monitored.

By contrast, according to the prior art described in Japanese Laid-Open Publication No. 10-149382, simulation or debugging can be checked only at an event unit but not at a clock cycle unit. According to the prior art described in Japanese Laid-Open Publication No. 2001-14356, the operation of a circuit obtained by high level synthesis can be simulated at a clock cycle unit, but a storage section (register) for storing the state is not provided. A variable for storing the state is not set. Therefore, according to this prior art, monitoring at a clock cycle unit cannot be performed to detect a part in which the discrepancy occurs. It is important to check the state of the circuit in debugging hardware, since the state of the circuit, especially, the state of the register and the state of the controller, is often material for finding the cause of the discrepancy.

In the above description, the register R is used as an exemplary component. The present invention is not limited to this. In order to calculate the states of a plurality of components, a component reading variable and a component writing variable may be prepared. Furthermore, a component reading variable storage area and a component writing variable storage area may be provided for storing these variables in a buffer or register. The state of the component may be calculated using a component state calculation expression.

With the cycle accurate model generated in the first example, hardware can be debugged at higher speed than by an HDL simulator. Since the cycle accurate model is described with a general-purpose programming language such as the C language or the like, hardware can be simulated using a low-cost C compiler. Therefore, an expensive HDL simulator is not necessary.

In a verification performed using a cycle accurate model described with the C language generated in the first example, the simulation was performed about 6 to 40 times faster than the simulation performed on a circuit of RTL using an HDL simulator. It is easily assumed that the speed of simulation significantly varies in accordance with the contents of the LSI, but the present invention realizes at least a faster simulation than use of an HDL simulator.

EXAMPLE 2

In the second example of the present invention, a cycle accurate model is generated as a general-purpose programming language model which is capable of simulating a circuit, including a memory device such as a RAM or the like as a component, at a cycle accurate level.

Figure 17:
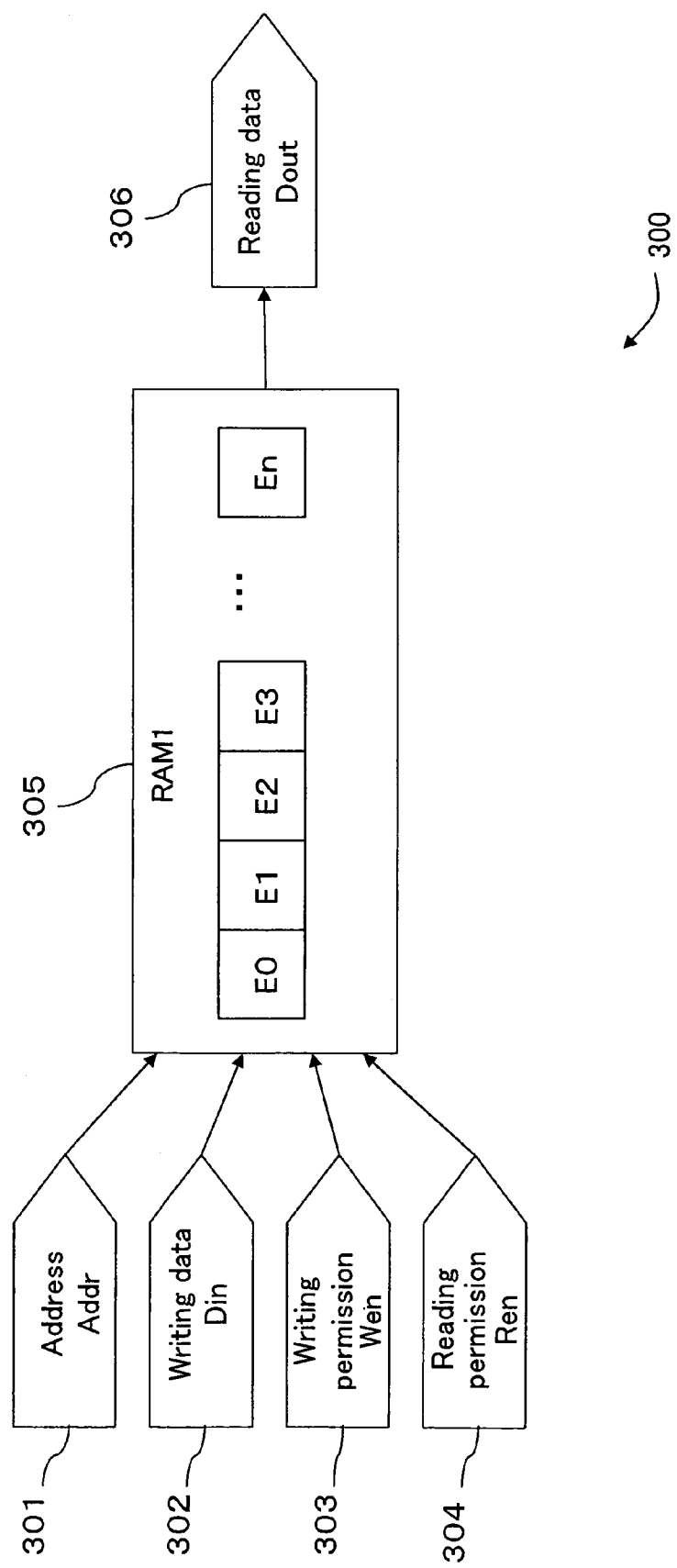
FIG. 17 is a schematic circuit diagram of a circuit, for which a general-purpose programming language model capable of simulating hardware at a cycle accurate level is to be performed according to a second example of the present invention.

FIG. 17 is a schematic circuit diagram of a circuit 300 for which a cycle accurate model is to be generated by a cycle accurate model automatic generation section 113A in the second example. In this example, the cycle accurate model automatic generation section 113 in the first example is represented by the reference numeral 113A.

The circuit 300 operates as follows. A memory 305 receives an address data signal 301, a writing data signal 302, a writing permission signal 303, and a reading permission signal 304 from an external device. The memory 305 outputs a reading data signal 306 to an external device. In FIG. 17, the address data signal 301 is represented by "Addr", the writing data signal 302 is represented by "Din", the writing permission signal 303 is represented by "Wen", the reading permission signal 304 is represented by "Ren", the memory 305 is represented by "RAM1", and the reading data signal 306 is represented by "Dout". The memory 305 includes a plurality of elements E0, E1, E2, E3, ... En (n is a natural number).

FIG. 18 shows a VHDL description which represents an operation model of the memory 305 of the circuit 300 shown in FIG. 17.

FIG. 18 shows the following operation. The reading data signal Dout is read from the memory 305 or the writing data signal Din is written in the memory 305, both in synchronization with the clock. It is assumed that only one element in the memory 305 is indicated by the address signal Addr as an element used for reading or writing in one clock cycle. In the operation model of the memory 305, a writing permission signal Wen and the reading permission signal Ren are active when having the value of "1". When the writing permission signal Wen and the reading permission signal Ren to the RAM 1 become active simultaneously in the same clock cycle, the writing operation has priority.

FIG. 19 shows a description which represents processing of a calculation step performed for the circuit 300 shown in FIG. 17.

FIG. 20 shows a description which represents processing of an updating step performed for the circuit 300 shown in FIG. 17.

FIGS. 19 and 20 show an example of generating the cycle accurate model in the second example such that an operation equivalent to the VHDL description shown in FIG. 18 is performed for the memory 305 (FIG. 17).

In more detail, FIG. 19 shows a calculation function calculate_RAM1( ) for performing the calculation step of calculating the value of the RAM1 using a reading variable RAM1_rdata and storing the obtained value in a writing variable RAM1_wdata.

FIG. 20 shows an updating function update_RAM1_all( ) for performing the updating step of updating the result of the calculation performed in the calculation step (the value of the writing variable) into a reading variable.

In the calculation function calculate_RAM1( ) shown in FIG. 19 and in the updating function update_RAM1_all( ) in FIG. 20, the reading variable of the RAM1 is represented by array RAM1_rdata[ ], and the writing variable of the RAM1 is represented by array RAM1_wdata[ ]. RAM1_rdata[ ] represents the value of the RAM1 at a clock cycle for which a simulation is to be performed, and RAM1_wdata[ ] represents the value of the RAM1 at a clock cycle next to the clock cycle for which a simulation is to be performed. The number of elements of the RAM1 is represented by constant SIZE.

According to the calculation function calculate_RAM1( ) shown in FIG. 19, when the writing permission signal Wen and the reading permission signal Ren become active simultaneously in the same clock cycle, the writing operation has priority, like with the VHDL description model shown in FIG. 18.

According to the updating function update_RAM1_all( ) in FIG. 20, the value of the reading variable RAM1_rdata[ ] is updated to the value of the writing variable RAM1_wdata[ ], like in the updating processing of the register R described above regarding the circuit 200 shown in FIG. 3.

In the operation model shown in FIG. 18, only one element represented by the address Addr is used for reading or writing during one clock cycle. Accordingly, the updating function update_RAM1_all( ) shown in FIG. 20 can be represented as a different updating function.

FIG. 21 shows a description which represents exemplary updating processing performed for the circuit 300 shown in FIG. 17 for improving efficiency.

With the updating function update_RAM1_all( ) shown in FIG. 20, all the elements in the RAM1 are updated. With an updating function update_RAM1_( ) shown in FIG. 21, only the element(s) which has been subjected to writing by the function calculate_RAM1( ) used in the calculation step are updated.

The updating function update_RAM1_all( ) shown in FIG. 20 and the updating function update_RAM1_( ) shown in FIG. 21 are significantly different in processing time. With the updating function update_RAM1_( ) shown in FIG. 21, the reading variable RAM1_rdata can be updated faster than with the updating function update_RAM1_all( ) shown in FIG. 20.

As described above, when generating a general-purpose programming language model capable of simulating a memory device at a cycle accurate level, the reading variable can be updated only for the element(s) which has been calculated in the calculation step. In this manner, the simulation time can be shortened, and thus the efficiency can be improved.

EXAMPLE 3

Figure 22:
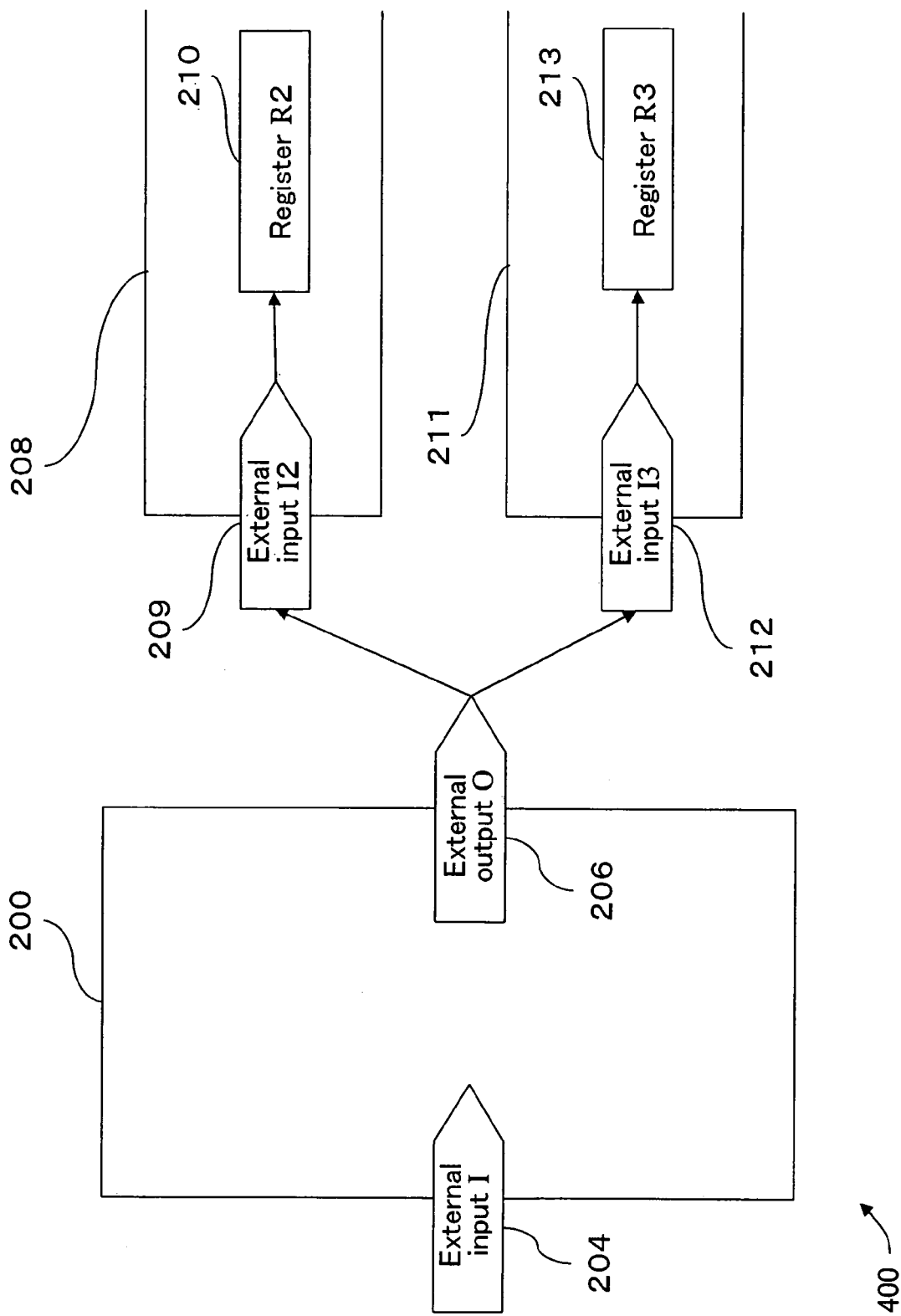
FIG. 22 is a schematic circuit diagram of a circuit, for which a general-purpose programming language model capable of simulating hardware at a cycle accurate level is to be generated according to a third example of the present invention.

FIG. 22 is a schematic circuit diagram of a circuit 400 for which a cycle accurate model is to be generated by a cycle accurate model automatic generation section 113B in the third example. In this example, the cycle accurate model automatic generation section 113 in the first example is represented by the reference numeral 113A.

The circuit 400 includes three circuit blocks, i.e., a circuit block 200, a circuit block 208, and a circuit block 211.

In the example shown in FIG. 22, the circuit 200 shown in FIG. 3 is represented as one circuit block 200. An external output port 206 of the circuit block 200 is connected to an external input port 209 of the circuit block 208 and an external input port 212 of the circuit block 211.

In the circuit block 208, the external input port 209 is connected to a register 210. In the circuit block 211, the external input port 212 is connected to a register 213. In FIG. 22, the external input port 209 is represented by "I2", and the external input port 212 is represented by "I3". The register 210 is represented by "R2", and the register 213 is represented by "R3".

FIG. 23 shows a description which represents processing of a calculation step performed for the register R2 included in the circuit block 208 in the circuit 400 shown in FIG. 22.

FIG. 23 shows a calculation function calculate_block2( ) for performing the calculation step of calculating the value of the register R2 using a register reading variable R2_rdata and storing the obtained value in a register writing variable R2_wdata.

FIG. 24 shows a description which represents processing of a calculation step performed for the register R3 included in the circuit block 211 in the circuit 400 shown in FIG. 22.

FIG. 24 shows a calculation function calculate_block3( ) for performing the calculation step of calculating the value of the register R3 using a register reading variable R3_rdata and storing the obtained value in a register writing variable R3_wdata.

With the calculation function calculate_block2( ) shown in FIG. 23 and the calculation function calculate_block3( ) shown in FIG. 24, calculation expressions for calculating the value of the register R2 included in the circuit block 208 and the value of the register R3 included in the circuit block 211 in the next clock cycle (writing variables R2_wdata and R3_wdata) are both executed with reference to the value of the external output port O from the circuit block 200.

According to the data path information on the circuit block 200 shown in FIG. 7, the value of the external output port O is obtained by a calculation expression of the arithmetic operator OP. This calculation expression of the arithmetic operator OP is represented by the function execOP( ), like the register state calculation expression of the register R shown in FIG. 11. Here, in both the calculation step for the circuit block 208 and the calculation step for the circuit block 211, the function execOP( ) is executed.

In the third example, once the calculation result of the function execOP( ) is obtained, the clock cycle at that time is stored. Thus, even though the function execOP( ) is to be executed in the simulation of the same clock cycle, the same calculation is not repeated.

FIG. 25 shows a description which represents exemplary processing for preventing calculations from being repeated for the circuit 400 shown in FIG. 22.

The example shown in FIG. 25 uses the function execOP( ).

With the execOP( ) shown in FIG. 25, two variables for indicating the value of the clock cycle, i.e., cycle_last_calculated and cycle_current_calculate, are used. The variable cycle_last_calculated represents the value of the clock cycle for which the latest simulation has been performed using the function execOP( ). The variable cycle_current_calculate represents the value of the clock cycle for which a simulation is to be currently performed.

As shown in FIG. 25, when the variable cycle_current_calculate is less than the value of the variable cycle_last_calculated, it is meant that the function execOP( ) has not been executed in the clock cycle for which a simulation is to be performed. In this case, the arithmetic operator OP performs a calculation, so that the value of the variable cycle_last_calculated is updated to the value of the variable cycle_current_calculate. In other cases, it is meant that the function execOP( ) has been executed in the clock cycle for which a simulation is to be performed. Therefore, no calculation is performed.

With such processing, even when the function execOP( ) is executed a plurality of times in one clock cycle, the arithmetic operation OP performs the calculation only once. In this manner, the simulation time can be shortened, and thus the efficiency can be improved.

As described above, according to the first through third examples of the present invention, the high level synthesis device 10, for analyzing an operation of hardware description stored in the hardware operation description storage section 101, and performing high level synthesis of the hardware at a register transfer level from the information obtained by analyzing the operation description, operates as shown in FIG. 2. Specifically, a calculation expression for calculating the state of the register and a calculation expression for calculating the state of the controller are created by the cycle accurate model automatic generation section 113 (or 113A or 113B). The calculation expressions are created based on (i) the component operation information, to which an operation description is assigned, stored in the component operation information storage section 109, (ii) the data path information, which represents information regarding at least one of a connection between a component and another component among a plurality of components or a connection between one of the components and a controller for controlling the components, stored in the data path information storage section 111, and (iii) the controller state transition information stored in the controller information storage section 110. Then, the created calculation expressions are generated as a description, which is described with a general-purpose programming language and is used for verifying the hardware at a cycle accurate level. Thus, a cycle accurate model is created. In this manner, a general-purpose programming language model for verifying the hardware at a clock cycle unit without using an HDL simulator can be created.

According to the present invention, verification of hardware can be performed at a cycle accurate level at higher speed and lower cost than the conventional verification using an HDL simulator. At an arbitrary clock cycle, the states of the register, the controller, the memory device or the like included in the hardware can be monitored. Therefore, the debugging efficiency of the hardware can be improved.

For simulating the state of each of the register, the controller, the memory device or the like included in the hardware, two variables, i.e., a reading variable and a writing variable are set. Therefore, it is not necessary to determine the order of calculation of these variables, and thus the model can be generated with high efficiency.

For simulating a memory device including a plurality of elements, only the element(s) which has been subjected to calculation is updated. Thus, the speed of simulation can be further increased.

In the case where the same calculation is to be performed in repetition in one clock cycle for an arithmetic operator, an output port of a component, or the like, the calculation is performed as follows. The calculation in that clock cycle is checked, and if the calculation has been is already performed, the same calculation is not repeated. Thus, the simulation speed is further increased.

For verifying a system including hardware and software in designing a system LSI, a cycle accurate model for verifying the hardware can be generated with a general-purpose programming language using the high level synthesis device according to the present invention. In this case, the object code of the model and the object code of the software can be linked to each other. Thus, the simulation of the hardware and the simulation of the software can be performed in synchronization with each other at a clock cycle level. Accordingly, debugging and verification of such a system including hardware and software at a cycle accurate level can be performed efficiently.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A high level synthesis device, comprising:
    a high level synthesis section for performing high level synthesis of hardware including a plurality of components and a controller for controlling the plurality of components; and
    a cycle accurate model generation section for generating a cycle accurate model, configured to verify a state of at least one of the plurality of components and the controller at a cycle accurate level at an arbitrary clock cycle, with a general-purpose programming language, wherein
    the cycle accurate model generation section generates the cycle accurate model based on (i) operation information on the plurality of components, (ii) connection information which represents at least one of a connection between a component and another component among the plurality of components and a connection between one of the plurality of components and the controller, and (iii) controller information which represents a state transition of the controller, and
    the cycle accurate model generation section generates component state calculation expressions for calculating states of the plurality of components and a controller state calculation expression for calculating a state of the controller with the general-purpose programming language based on the operation information, the connection information, and the controller information.

2. A high level synthesis device according to claim 1, wherein the cycle accurate model generation section verifies the hardware using the cycle accurate model.

3. A high level synthesis device according to claim 1, wherein the high level synthesis section performs high level synthesis of the hardware at a register transfer level.

4. A high level synthesis device according to claim 1, wherein:
    the cycle accurate model generation section sets reading variables and writing variables; and
    the cycle accurate model generation section sets reading variable storage areas for storing the reading variables and writing variable storage areas for storing the writing variables.

5. A high level synthesis device according to claim 4, wherein:
    the reading variables include component reading variables indicating variables which are read from the plurality of components and a controller reading variable indicating a variable which is read from the controller;
    the writing variables include component writing variables indicating variables which are to be written into the plurality of components and a controller writing variable indicating a variable which is to be written into the controller;
    the reading variable storage areas include component reading variable storage areas for storing the component reading variables, and a controller reading variable storage area for storing the controller reading variable; and
    the writing variable storage areas include component writing variable storage areas for storing the component writing variables, and a controller writing variable storage area for storing the controller writing variable.

6. A high level synthesis device according to claim 5, wherein the cycle accurate model generation section generates, with the general-purpose programming language, (i) a calculation function for calculating the states of the components and the state of the controller from the reading variables using the component state calculation expressions and the controller state calculation expression, and writing the calculation results into the component writing variables and the controller writing variable; and (ii) an updating function for updating the component reading variables and the controller reading variable into the calculation results.

7. A high level synthesis device according to claim 6, wherein the cycle accurate model generation section calculates the states of the components and the state of the controller from the reading variables using the calculation functions, writes the calculation results into the component writing variables and the controller writing variable, and updates the component reading variables and the controller reading variable into the calculation results using the updating function.

8. A high level synthesis device according to claim 7, wherein:
    the plurality of components include a register; and
    the component state calculation expressions include a register state calculation expression for calculating the state of the register.

9. A high level synthesis device according to claim 8, wherein:
    he component reading variable include a register reading variable indicating a variable which is read from the register; the component writing variables include a register writing variable indicating a variable which is written into the register;
    the component reading variable storage areas include a register reading variable storage area for storing the register reading variable; and
    the component writing variable storage areas include a register writing variable storage area for storing the register writing variable.

10. A high level synthesis device according to claim 9, wherein:
the calculation function includes a function for calculating the state of the register from the reading variables using the register state calculation expression, and writing the calculation result into the register writing variable; and
the updating function includes a function for updating the register reading variable into the calculation result.

11. A high level synthesis device according to claim 10, wherein:
the plurality of components include a memory device; and
the cycle accurate model generation section calculates a state of the memory device from the reading variables.

12. A high level synthesis device according to claim 11, wherein the component state calculation expressions include a memory device state calculation expression for calculating the state of the memory device.

13. A high level synthesis device according to claim 12, wherein:
the component reading variables include a memory device reading variable indicating a variable which is read from the memory device;
the component writing variables include a memory device writing variable indicating a variable which is written into the memory device;
the component reading variable storage areas include a memory device reading variable storage area for storing the memory device reading variable; and
the component writing variable storage areas include a memory device writing variable storage area for storing the memory device writing variable.

14. A high level synthesis device according to claim 13, wherein:
the calculation function includes a function for calculating the state of the memory device from the reading variables using the memory device state calculation expression, and writing the calculation result into the memory device writing variable; and the updating function includes a function for updating the memory device reading variable into the calculation result.

15. A high level synthesis device according to claim 14, wherein the cycle accurate model generation section calculates the state of the memory device from the reading variables using the calculation function, writes the calculation result into the memory device writing variable, and updates the memory device reading variable into the calculation result using the updating function.

16. A high level synthesis device according to claim 15, wherein:
the memory device includes a plurality of elements; and
the cycle accurate model generation section updates an element for which the calculation has been performed and does not update an element for which the calculation has not been performed regarding the state of the memory device.

17. A high level synthesis device according to claim 16, wherein when an identical calculation is to be performed in repetition, and the calculation has been already performed, the result of the calculation which has been performed is used without repeating the same calculation.

18. A method for generating a model for verifying hardware including a plurality of components and a controller for controlling the plurality of components, the method comprising the steps of:
performing high level synthesis of the hardware; and
generating a cycle accurate model, configured to verify a state of at least one of the plurality of components and the controller at a cycle accurate level at an arbitrary clock cycle with a general-purpose programming language, wherein the step of generating the cycle accurate model includes,
the step of generating the cycle accurate model based on (i) operation information on the plurality of components, (ii) connection information which represents at least one of a connection between a component and another component among the plurality of components and a connection between one of the plurality of components and the controller, and (iii) controller information which represents a state transition of the controller, and
the step of generating component state calculation expressions for calculating states of the plurality of components and a controller state calculation expression for calculating a state of the controller with the general-purpose programming language based on the operation information, the connection information, and the controller information.

19. A method according to claim 18, wherein the step of generating the cycle accurate model includes the step of setting reading variables and writing variables, and setting reading variable storage areas for storing the reading variables and writing variable storage areas for storing the writing variables.

20. A method according to claim 19, wherein:
the reading variables include component reading variables indicating variables which are read from the plurality of components and a controller reading variable indicating a variable which is read from the controller;
the writing variables include component writing variables indicating variables which are to be written into the plurality of components and a controller writing variable indicating a variable which is to be written into the controller;
the reading variable storage areas include component reading variable storage areas for storing the component reading variables, and a controller reading variable storage area for storing the controller reading variable; and
the writing variable storage areas include component writing variable storage areas for storing the component writing variables, and a controller writing variable storage area for storing the controller writing variable.

21. A method according to claim 20, wherein the step of generating the cycle accurate model includes the step of generating, with the general-purpose programming language, (i) a calculation function for calculating the states of the components and the state of the controller from the reading variables using the component state calculation expressions and the controller state calculation expression, and writing the calculation results into the component writing variables and the controller writing variable; and (ii) an updating function for updating the component reading variables and the controller reading variable into the calculation results.

22. A method according to claim 21, wherein:
the plurality of components include a register; and the component state calculation expressions include a register state calculation expression for calculating the state of the register.

23. A method according to claim 22, wherein:
the component reading variables include a register reading variable indicating a variable which is read from the register; the component writing variables include a register writing variable indicating a variable which is written into the register;

the component reading variable storage areas include a register reading variable storage area for storing the register reading variable; and the component writing variable storage areas include a register writing variable storage area for storing the register writing variable.

24. A method according to claim 23, wherein:

the calculation function includes a function for calculating the state of the register from the reading variables using the register state calculation expression, and writing the calculation result into the register writing variable; and the update function includes a function for updating the register reading variable into the calculation result.

25. A method according to claim 24, wherein:

the plurality of components include a memory device; and the component state calculation expressions include a memory device state calculation expression for calculating a state of the memory device.

26. A method according to claim 25, wherein:

the component reading variables include a memory device reading variable indicating a variable which is read from the memory device; the component writing variables include a memory device writing variable indicating a variable which is written into the memory device;

the component reading variable storage areas include a memory device reading variable storage area for storing the memory device reading variable; and the component writing variable storage areas include a memory device writing variable storage area for storing the memory device writing variable.

27. A method according to claim 26, wherein:

the calculation function includes a function for calculating the state of the memory device from the reading variables using the memory device state calculation expression, and writing the calculation result into the memory device writing variable; and the updating function includes a function for updating the memory device reading variable into the calculation result.

28. A readable recording medium having a control program recorded thereon for causing a computer to execute the steps of:

performing high level synthesis of hardware including a plurality of components and a controller for controlling the plurality of components; and generating a cycle accurate model, configured to verify a state of at least one of the plurality of components and the controller at a cycle accurate level at an arbitrary clock cycle with a general-purpose programming language, wherein the step of generating the cycle accurate model includes, the step of generating the cycle accurate model based on (i) operation information on the plurality of components, (ii) connection information which represents at least one of a connection between a component and another component among the plurality of components and a connection between one of the plurality of components and the controller, and (iii) controller information which represents a state transition of the controller, and the step of generating component state calculation expressions for calculating states of the plurality of components and a controller state calculation expression for calculating a state of the controller with the general-purpose programming language based on the operation information, the connection information, and the controller information.

29. A method for verifying hardware including a plurality of components and a controller for controlling the plurality of components, the method comprising the steps of:

performing high level synthesis of the hardware;

generating a cycle accurate model, configured to verify a state of at least one of the plurality of components and the controller at a cycle accurate level at an arbitrary clock cycle with a general-purpose programming language; and verifying the hardware using the cycle accurate model, wherein the step of generating the cycle accurate model includes, the step of generating the cycle accurate model based on (i) operation information on the plurality of components, (ii) connection information which represents at least one of a connection between a component and another component amoung the plurality of components and a connection between one of the plurality of components and the controller, and (iii) controller information which represents a state transition of the controller, and the step of generating component state calculation expressions for calculating states of the plurality of components and a controller state calculation expression for calculating a state of the controller with the general-purpose programming language based on the operation information, the connection information, and the controller information.

30. A method according to claim 29, wherein the step of generating the cycle accurate model includes the step of setting reading variables and writing variables, and setting reading variable storage areas for storing the reading variables and writing variable storage areas for storing the writing variables.

31. A method according to claim 30, wherein:

the reading variables include component reading variables indicating variables which are read from the plurality of components and a controller reading variable indicating a variable which is read from the controller;

the writing variables includes component writing variables indicating variables which are to be written into the plurality of components and a controller writing variable indicating a variable which is to be written into the controller;

the reading variable storage areas include component reading variable storage areas for storing the component reading variables, and controller reading variable storage areas for storing the controller reading variables; and the writing variable storage areas include a component writing variable storage areas for storing the component writing variables, and a controller writing variable storage area for storing the controller writing variable.

32. A method according to claim 31, wherein the step of generating the cycle accurate model includes the step of generating, with the general-purpose programming language, (i) a calculation function for calculating the states of the components and the state of the controller from the reading variables using the component state calculation expressions and the controller state calculation expression, and writing the calculation results into the component writing variables and the controller writing variable; and (ii) an updating function for updating the component reading variables and the controller reading variable into the calculation results.

33. A method according to claim 32, wherein the step of verifying includes the step of calculating the states of the components and the state of the controller from the reading variables using the calculation function, writes the calculation results into the component writing variables and the controller writing variable, and updates the component reading variables and the controller reading variable into the calculation results using the updating function.

34. A method according to claim 33, wherein:
the plurality of components include a register; and the component state calculation expressions include a register state calculation expression for calculating the state of the register.

35. A method according to claim 34, wherein:
the component reading variables include a register reading variable indicating a variable which is read from the register;
the component writing variable include a register writing variable indicating a variable which is written into the register;
the component reading variable storage areas include a register reading variable storage area for storing the register reading variable; and
the component writing variable storage areas include a register writing variable storage area for storing the register writing variable.

36. A method according to claim 35, wherein:
the calculation function includes a function for calculating the state of the register from the reading variables using the register state calculation expression, and writing the calculation result into the register writing variable; and
the updating function includes a function for updating the register reading variable into the calculation result.

37. A method according to claim 36, wherein the step of verifying includes the step of calculating the state of the register from the reading variables using the calculation function, writes the calculation result into the register writing variable, and updates the register reading variable into the calculation result using the updating function.

38. A method according to claim 37, wherein:
the plurality of components include a memory device; and the component state calculation expressions include a memory device state calculation expression for calculating the state of the memory device.

39. A method according to claim 38, wherein:
the component reading variables include a memory device reading variable indicating a variable which is read from the memory device;
the component writing variables include a memory device writing variable indicating a variable which is written into the memory device; the component reading variable storage areas include a memory device reading variable storage area for storing the memory device reading variable; and
the component writing variable storage areas include a memory device writing variable storage area for storing the memory device writing variable.

40. A method according to claim 39, wherein:
the calculation function includes a function for calculating the state of the memory device from the reading variables using the memory device state calculation expression, and writing the calculation result into the memory device writing variable; and
the updating function includes a function for updating the memory device reading variable into the calculation result.

41. A method according to claim 40, wherein the step of verifying includes the step of calculating the state of the memory device from the reading variables using the calculation function, writing the calculation result into the memory device writing variable, and updating the memory device reading variable into the calculation result using the updating function.

42. A method according to claim 40, wherein the step of verifying includes the step of updating an element for which the calculation has been performed and not updating an element for which the calculation has not been performed regarding the state of the memory device.

43. A method according to claim 42, wherein the step of verifying includes the step of, when an identical calculation is to be performed in repetition, and the calculation has been already performed, using the result of the calculation which has been performed without repeating the same calculation.

44. A readable writing medium having a control program recorded thereon for causing a computer to execute the steps of:
performing high level synthesis of hardware including a plurality of components and a controller for controlling the plurality of components;
generating a cycle accurate model, configured to verify a state of at least one of the plurality of components and the controller at a cycle accurate level at an arbitrary clock cycle with a general-purpose programming language; and verifying the hardware using the cycle accurate model, wherein the step of generating the cycle accurate model includes,
the step of generating the cycle accurate model based on (i) operation information on the plurality of components, (ii) connection information which represents at least one of a connection between a component and another component among the plurality of the components and a connection between one of the plurality of components and the controller, and (iii) controller information which represents a state transition of the controller, and
the step of generating component state calculation expressions for calculating states of the plurality of components and a controller state calculation expression for calculating a state of the controller with the general-purpose programming language based on the operation information, the connection information, and the controller information.

* * * * *